United States Patent
Paupert

(10) Patent No.: US 10,120,007 B2
(45) Date of Patent: Nov. 6, 2018

(54) DEVICE AND METHOD FOR VARIABLY ATTENUATING AN ELECTROMAGNETIC SIGNAL RADIATED BY A MICROWAVE SOURCE

(71) Applicant: Commissariat à l'énergie atomique et aux énergies alternatives, Paris (FR)

(72) Inventor: Alain Paupert, Lacapelle Marival (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 271 days.

(21) Appl. No.: 14/442,138

(22) PCT Filed: Nov. 12, 2013

(86) PCT No.: PCT/EP2013/073599
§ 371 (c)(1),
(2) Date: May 12, 2015

(87) PCT Pub. No.: WO2014/076070
PCT Pub. Date: May 22, 2014

(65) Prior Publication Data
US 2016/0291071 A1    Oct. 6, 2016

(30) Foreign Application Priority Data
Nov. 14, 2012    (FR) ...................... 12 60839

(51) Int. Cl.
*G01R 27/04*    (2006.01)
*G01R 29/08*    (2006.01)
*H01Q 17/00*    (2006.01)

(52) U.S. Cl.
CPC ........... *G01R 29/08* (2013.01); *H01Q 17/007* (2013.01)

(58) Field of Classification Search
CPC ............ G01N 2030/567; G01N 21/35; G01N 21/274; G01N 2021/3133;
(Continued)

(56) References Cited

U.S. PATENT DOCUMENTS

| 3,302,101 | A | * | 1/1967 | Glanville | ............. | G01N 27/048 324/376 |
| 4,482,634 | A | * | 11/1984 | Davis, Jr. | ................. | C09K 8/58 166/252.1 |

(Continued)

FOREIGN PATENT DOCUMENTS

| CN | 1758844 A | 4/2006 |
| EP | 2 328 232 A1 | 6/2011 |
| GB | 761 366 | 11/1956 |

OTHER PUBLICATIONS

Translation of International Preliminary Report on Patentability issued in Application No. PCT/EP2013/073599 dated May 21, 2015.

(Continued)

*Primary Examiner* — Vinh Nguyen
(74) *Attorney, Agent, or Firm* — Pearne & Gordon LLP

(57) ABSTRACT

An attenuation device for variably attenuating an electromagnetic signal radiated by a microwave source includes a cylinder formed by a cylinder wall having a first flange and a second flange. The cylinder wall is closed at a first end thereof by the first flange and at a second end thereof by the second flange. The cylinder wall is pierced at the first end by a liquid inlet/outlet port and at the second end by an air inlet/outlet port. The attenuation device further includes a piston being arranged in the cylinder and being displaceable in the cylinder. The piston bounds with the first flange a variable volume filled with an electromagnetic energy (Continued)

absorbing liquid. The attenuation device further includes a displacement sensor for sensing a position of the piston the cylinder.

6 Claims, 1 Drawing Sheet

(58) Field of Classification Search
CPC ....... G01N 2030/528; G01N 2030/025; G01N 2030/324; G01N 21/05; G01N 30/52; G01N 33/50; G01N 35/1097; G06F 1/206; B01L 2400/0487; B01L 2400/0406; B01L 3/502738; B01L 2400/0415; B01L 2200/0647; B01L 2300/0864; B01L 2300/123; H02J 17/00; H02J 50/30; H02J 9/00; H01M 10/345; G01R 29/08; G01R 33/281; G01R 33/282; G01R 33/31; G01R 33/3815; H02N 3/00; G01F 25/0015; G01F 25/0053; G01S 13/931; G01S 2013/9325; G01S 2013/9346; G01S 2013/9353; G01S 2013/9364; G01S 2013/9375; H01Q 17/007; H03L 7/04
See application file for complete search history.

(56) References Cited

U.S. PATENT DOCUMENTS

| 7,978,145 B2* | 7/2011 | Hauhe | H01Q 1/422 |
| | | | 343/841 |
| 2005/0017819 A1 | 1/2005 | Brown | |

OTHER PUBLICATIONS

Search Report issued in French Patent Application No. FR 12 60839 dated Sep. 3, 2013.
International Preliminary Report on Patentability issued in Application No. PCT/EP2013/073599 dated Feb. 16, 2015.
International Search Report issued in Application No. PCT/EP2013/073599 dated Jan. 16, 2014.
Korovin, S. et al., "Modificaiton du Generateur Micro-Ondes de Forte Puissance Sinus 500", DGA/DGE/CEG Marché n° 9925028, Final report n° IS RF 99-079A, ITHPP-HCEI, Apr. 11, 2000.

* cited by examiner

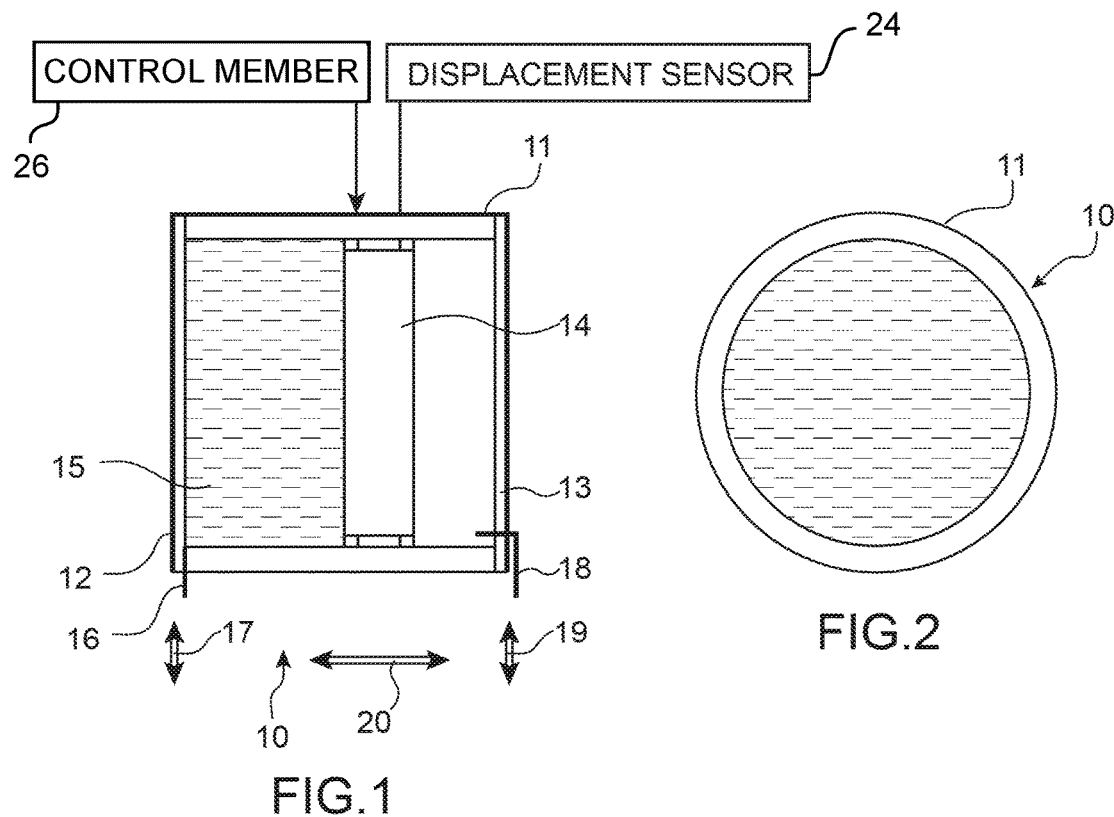
FIG.1
FIG.2
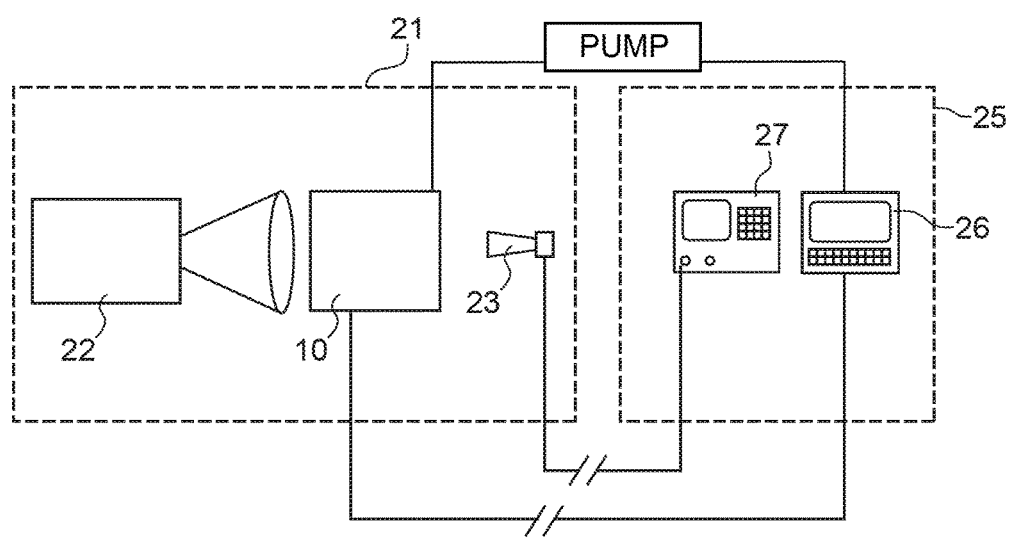
FIG.3

DEVICE AND METHOD FOR VARIABLY ATTENUATING AN ELECTROMAGNETIC SIGNAL RADIATED BY A MICROWAVE SOURCE

TECHNICAL FIELD

The invention relates to a device and a method for variably attenuating a radiated microwave signal.

The field of the invention is the field of microwave electromagnetics and more particularly that of attenuators for measuring microwave electromagnetic fields in the range 1 GHz-18 GHz, for example for high powers ranging from a few kilowatts to hundreds of megawatts in pulsed mode.

STATE OF PRIOR ART

In the field of the invention, fixed attenuation alcohol attenuators are known. As described in the document referred to as [1] at the end of the description, these attenuators can consist of two Plexiglas plates separated by a wedge on the perimeter and filled with alcohol. Each actuator's attenuation is determined by the alcohol thickness. The attenuation value varies as a function of the frequency. By combining several attenuators, an attenuation variation is obtained.

But such attenuators have the following drawbacks. It is difficult to obtain a repetitive and gradual value of the attenuation values as a function of the combinations used. The attenuation value of the combination used does not necessarily correspond to the sum of the attenuation values of each attenuator. It is not easy to handle screens because of their weight. It is necessary to work in a secured zone (electromagnetic hazard and ionizing radiations) to modify the number and position of the screens.

The object of the invention is to provide a device and a method for microwave attenuation for high powers enabling these drawbacks to be overcome.

DISCLOSURE OF THE INVENTION

The invention relates to a device for variably attenuating a radiated microwave signal, for example for high powers ranging from a few kilowatts to hundreds of megawatts in pulsed mode, which comprises a tight cylinder with a variable volume filled with an electromagnetic energy absorbing liquid and remote control means, characterized in that it comprises a cylinder formed by a cylinder wall closed on either side by a first and a second flanges, in which a piston, bounding with the first flange a volume filled with this liquid can be displaced, the cylinder wall being pierced at its first end, located on the side of the first flange, with a liquid inlet/outlet port, the second flange being pierced with an air inlet/outlet port, a displacement sensor enabling the displacement of the piston to be known.

Advantageously, this liquid is alcohol.

Advantageously, the control means of the device of the invention comprise:
- an interface unit for controlling electromagnetic valves and alcohol pumps,
- an interface unit for remote control.

Advantageously, the different elements which make up this device are of polyethylene and/or polycarbon.

The invention also relates to a microwave attenuation method for high powers ranging from a few kilowatts to hundreds megawatts in pulsed mode, using such a device wherein the piston is displaced by a desired length.

The device according to the invention has the following advantages:
- a better controlled attenuation,
- no intervention in the secured zone of the source,
- a remote driving of the attenuation value.

The device of the invention is usable for a high power microwave generator.

BRIEF DESCRIPTION OF THE DRAWINGS

FIGS. 1 and 2 schematically illustrate the device of the invention in a side view and a front view.

FIG. 3 illustrates a block diagram for the implementation of the device of the invention.

DETAILED DISCLOSURE OF PARTICULAR EMBODIMENTS

The invention aims at remotely varying a volume of a radiated electromagnetic energy absorbing liquid, for example alcohol, in a tight cylinder, by displacing a piston subjected to a pressure. The volume of this liquid is controlled by a displacement sensor which locates the position of the piston in the cylinder. Filling and discharging this liquid are performed by a pump. The displacement of the piston is carried out by a pneumatic control.

The materials used in the device of the invention are neutral from the electromagnetic point of view.

As illustrated in FIGS. 1 and 2, the device of the invention 10 comprises a cylinder formed by a cylinder wall 11 closed on either side by a first and a second flange, in which a piston 14, bounding with the first flange a volume filled with alcohol 15 can be displaced. The cylinder wall is pierced at its first end, located on the side of the first flange, by an alcohol 17 inlet/outlet port 16. The second flange 13 is pierced with an air 19 inlet/outlet port 18. A displacement sensor (24) enables the displacement 20 of the piston 14 to be known.

The control means of the device of the invention comprise:
- an interface unit for controlling the electromagnetic valves and the alcohol pumps,
- an interface unit for remote control.

FIG. 3 illustrates the implementation of the device of the invention 10, with:
- a testing cage 21, in which are provided:
  - a high power microwave source 22,
  - the device 10 described above,
  - an electromagnetic field measuring sensor 23,
- a control cage 25, in which are provided:
  - a control member 26,
  - a viewing member 27.

Thanks to the device of the invention, a volume of electromagnetic energy absorbing liquid, for example alcohol, is thus varied in a tight cylinder placed in front of a high power microwave source. The electromagnetic energy radiated is absorbed by this liquid and dissipated by heat exchange. The attenuation of the electromagnetic field is more or less significant according to the volume of this liquid placed in front of the source.

The characteristics of the device of the invention are the following:
- powers: a few kilowatts to hundred megawatts in pulsed mode,
- attenuation: from 3 to 40 dB,
- frequency range: 1 to 18 GHz,
- attenuation step: 0.5 dB.

In an advantageous exemplary embodiment, the device of the invention has the following characteristics:
- outer diameter: 530 mm,
- depth: 290 mm,
- piston diameter: 525 mm,
- actual displacement of the piston: 50 mm,
- maximum alcohol volume: 11 liters,
- alcohol type: 95% ethanol.

The material used for the different elements making up the variable volume tight cylinder of the device of the invention are polyethylene and/or polycarbon.

REFERENCES

[1] "Modification du générateur de forte puissance sinus 50" (DGA/DGE/CEG Marché n° 9925028; Final report n° IS RF 99-079A, Apr. 11, 2000)

What is claimed is:

1. An attenuation device for variably attenuating an electromagnetic signal radiated by a microwave source, the attenuation device comprising:
    a cylinder formed by a cylinder wall comprising a first flange, and a second flange, wherein the cylinder wall is closed at a first end thereof by the first flange and at a second end thereof by the second flange, further wherein the cylinder wall is pierced at the first end by a liquid inlet/outlet port and at the second end by an air inlet/outlet port;
    a piston being arranged in the cylinder and being displaceable in the cylinder, wherein the piston bounds with the first flange a variable volume filled with an electromagnetic energy absorbing liquid;
    a displacement sensor for sensing a position of the piston the cylinder; and
    a control member for remotely controlling the displacement of the piston.

2. The attenuation device according to claim 1, wherein the electromagnetic energy absorbing liquid is alcohol.

3. The attenuation device according to claim 2, further comprising:
    a pump configured to fill the variable volume with the electromagnetic energy absorbing liquid and to discharge the electromagnetic energy absorbing liquid from the variable volume; and
    an interface unit for controlling the pump.

4. The attenuation device according to claim 1, wherein the cylinder and the piston are made of polyethylene and/or polycarbon.

5. A measurement device for measuring an electromagnetic signal radiated by a microwave source, the measurement device comprising:
    a testing cage able to receive the microwave source, the testing cage comprising the attenuation device according to claim 1 and an electromagnetic field measuring sensor, the electromagnetic field measuring sensor being configured to measure an electromagnetic field output from the attenuation device,
    wherein the cylinder of the attenuation device is axially placed with respect to the microwave source, and
    wherein the electromagnetic field measuring sensor is axially placed with respect to the microwave source so that the cylinder of the attenuation device is arranged between the microwave source and the electromagnetic field measuring sensor.

6. A microwave attenuation method for attenuating an electromagnetic signal radiated by a microwave source, the electromagnetic signal having a power ranging from a few kilowatts to some hundreds megawatts in pulsed mode, the microwave attenuation method comprising the steps of:
    providing the attenuation device according to claim 1,
    setting an attenuation of the attenuation device by displacing the piston by a desired length to vary the variable volume filled with the electromagnetic energy absorbing liquid, and
    radiating the electromagnetic signal from the microwave source onto the attenuation device.

* * * * *